(12) United States Patent
Olson et al.

(10) Patent No.: US 9,160,292 B2
(45) Date of Patent: Oct. 13, 2015

(54) LOAD COMPENSATION IN RF AMPLIFIERS

(71) Applicant: Peregrine Semiconductor Corporation, San Diego, CA (US)

(72) Inventors: Chris Olson, Chicago, IL (US); Dan William Nobbe, Crystal Lake, IL (US); Jeffrey A. Dykstra, Woodstock, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 38 days.

(21) Appl. No.: 14/049,165

(22) Filed: Oct. 8, 2013

(65) Prior Publication Data

US 2015/0097624 A1  Apr. 9, 2015

(51) Int. Cl.
H03F 1/14 (2006.01)
H03F 3/68 (2006.01)
H03F 3/20 (2006.01)
H03F 3/189 (2006.01)

(52) U.S. Cl.
CPC ............... H03F 3/68 (2013.01); H03F 3/189 (2013.01); H03F 3/20 (2013.01)

(58) Field of Classification Search
CPC .............................. H03F 1/14; H03F 1/0211
USPC ..................................................... 330/51, 126
See application file for complete search history.

(56) References Cited

U.S. PATENT DOCUMENTS

| | | | |
|---|---|---|---|
| 6,342,810 B1 * | 1/2002 | Wright et al. | 330/51 |
| 7,135,919 B2 * | 11/2006 | Chen | 330/51 |
| 7,248,120 B2 | 7/2007 | Burgener et al. | |
| 7,714,664 B2 | 5/2010 | Kanaya et al. | |
| 7,795,968 B1 | 9/2010 | Li et al. | |
| 7,910,993 B2 | 3/2011 | Brindle et al. | |
| 8,129,787 B2 | 3/2012 | Brindle et al. | |
| 2006/0119435 A1 | 6/2006 | Oh et al. | |
| 2011/0002080 A1 | 1/2011 | Ranta | |
| 2011/0070848 A1 * | 3/2011 | Ramachandra Reddy | 455/127.2 |
| 2013/0222075 A1 | 8/2013 | Reedy et al. | |
| 2014/0184336 A1 | 7/2014 | Nobbe et al. | |
| 2014/0266455 A1 | 9/2014 | Kaatz et al. | |
| 2014/0266460 A1 | 9/2014 | Nobbe et al. | |

OTHER PUBLICATIONS

Nguyen, Khiem D., Office Action received from the USPTO dated Sep. 11, 2014 for related U.S. Appl. No. 13/829,946, 9 pgs.
Nobbe, et al., Response filed in the USPTO dated Dec. 11, 2014 for U.S. Appl. No. 13/829,946, 2 pgs.
Nguyen, Khiem D., Office Action received from the USPTO dated Feb. 23, 2015 for U.S. Appl. No. 13/829,946, 25 pgs.
Nobbe, et al., Response filed in the USPTO dated May 22, 2015 for U.S. Appl. No. 13/829,946, 23 pgs.
Nguyen, Khiem D., Office Action received from the USPTO dated Jul. 30, 2015 for U.S. Appl. No. 13/829,946, 11 pgs.

* cited by examiner

Primary Examiner — Steven J Mottola
(74) Attorney, Agent, or Firm — Jaquez Land Richman LLP; Martin J. Jaquez, Esq.; Alessandro Steinfl, Esq.

(57) ABSTRACT

Methods and systems for reducing parasitic loading on a power supply output in RF amplifier arrangements used in multiband and/or multitude RF circuits are presented. Such RF circuits can comprise a plurality of RF amplifiers of which only one is activated for a given desired transmission mode and/or band.

44 Claims, 9 Drawing Sheets

LOAD COMPENSATION IN RF AMPLIFIERS

BACKGROUND

1. Field

The present teachings relate to radio-frequency (RF) amplifiers used in RF circuits. More particularly, the present teachings relate to methods and systems for reducing parasitic loading, such as for example stray capacitance, in RF amplifiers used in multiband and multimode RF circuits.

2. Description of Related Art

In an effort to cover the many communication standards and frequency bands used in today's data and voice transmissions, RF circuits used in today's mobile devices are designed with multiple RF amplifiers (e.g. a power amplifier (PA)) each tailored to a specific communication standard and frequency band. During typical operation of the device (e.g. mobile handset, tablet) only one of the multiple RF amplifiers is activated (e.g. turned ON) and used for transmission of a signal, and the unused RF amplifiers are deactivated (e.g. turned OFF). A turned OFF RF amplifier can exhibit a residual loading, such as a stray capacitance, with respect to a common DC-DC power supply used to supply power to the multiple RF amplifiers. Such residual loading can affect the supply provided to a turned ON RF amplifier and thereby impact operation of the ON RF amplifier. This impact becomes even more apparent in the case where the DC-DC power supply is modulated, such as in the case of an envelope tracking amplifier.

SUMMARY

According to a first aspect of the present disclosure, a circuital arrangement is presented, the circuital arrangement comprising: a power supply unit; a plurality of power amplifier units, each configured to receive power from a common output port of the power supply unit, and each configured to amplify an input radio frequency (RF) signal at an input port of the each power amplifier unit in correspondence of a different frequency band and/or mode of operation of a plurality of different frequency bands and/or modes of operation; one or more decoupling circuits, wherein: during operation of the circuital arrangement one or more of the plurality of power amplifier units are deactivated, and each of the one or more decoupling circuits is configured to remove a loading effect of the one or more deactivated power amplifier units on the common output port of the power amplifier unit.

According to a second aspect of the present disclosure, a circuital arrangement is presented, the circuital arrangement comprising: a variable power supply unit; a plurality of power amplifier units, each configured to receive power from a common output port of the power supply unit, and each configured to amplify an input radio frequency (RF) signal at an input port of the each power amplifier unit in correspondence of a different frequency band and/or mode of operation of a plurality of different frequency bands and or modes of operation; a load compensation circuit, wherein: during operation of the circuital arrangement, one or more of the plurality of power amplifier units are deactivated, and the load compensation circuit is configured to control the variable power supply unit such as to compensate a loading effect of the one or more deactivated power amplifier units on the common output port of the power amplifier unit.

According to a third aspect of the present disclosure, a method for reducing loading of a power supply unit in a multi-mode and/or multi-band power amplifier arrangement is presented, the method comprising: providing a power supply unit; providing a plurality of power amplifier units; connecting the plurality of power amplifier units to a common output port of the power supply unit; selecting a band and/or mode of operation of the amplifier arrangement; based on the selecting, activating a corresponding power amplifier unit of the plurality of power amplifier units; based on the selecting, deactivating one or more power amplifier units of the plurality of power amplifier units; based on the deactivating, decoupling the one or more deactivated power amplifier units from the power supply unit, and based on the decoupling, reducing a loading effect of the one or more deactivated power amplifier units on the power supply unit.

According to a fourth aspect of the present disclosure, a method for compensating loading of a power supply unit in a multi-mode and/or multi-band power amplifier arrangement is presented, the method comprising: providing a variable power supply unit; providing a plurality of power amplifier units; connecting the plurality of power amplifier units to a common output port of the power supply unit; selecting a band and/or mode of operation of the amplifier arrangement; based on the selecting, activating a corresponding power amplifier unit of the plurality of power amplifier units; based on the selecting, deactivating one or more power amplifier units of the plurality of power amplifier units; based on the deactivating and the activating, compensating a characteristic of a variable output signal at the common output port of the variable power supply unit.

According to a fifth aspect of the present disclosure, a circuital arrangement is presented, the circuital arrangement comprising: a power supply unit; a plurality of power amplifier units, wherein two or more power amplifier units of the plurality of power amplifier units are configured to receive power from a common output port of the power supply unit, and to amplify an input radio frequency (RF) signal at an input port of the two or more power amplifier units in correspondence of a different frequency band and/or mode of operation of a plurality of different frequency bands and/or modes of operation, and a plurality of decoupling switches, wherein each of the two or more power amplifier units comprises: an RF amplifier comprising: an output port in correspondence of an output transistor of the RF amplifier, wherein the output port is operatively coupled to the common output port of the power supply unit; an input port in correspondence of an input transistor of the RF amplifier, wherein the input port is connected to the input port of the each power amplifier unit, and an output match network coupled to the output port in correspondence of the output transistor at a first port of the output match network, and connected to a first decoupling switch port of a decoupling switch of the plurality of decoupling switches at a second port of the output match network, wherein a second decoupling switch port of the decoupling switch is connected to a reference ground, wherein a third port of an output match network of a power amplifier unit of the two or more power amplifier units is configured to provide an amplified version of an input RF signal to the power amplifier unit of the two or more power amplifier units.

According to a sixth aspect of the present disclosure, a circuital arrangement is presented, the circuital arrangement comprising: a power supply unit; a plurality of power amplifier units, wherein two or more power amplifier units of the plurality of power amplifier units are configured to receive power from a common output port of the power supply unit, and to amplify an input radio frequency (RF) signal at an input port of the two or more power amplifier units in correspondence of a different frequency band and/or mode of operation of a plurality of different frequency bands and/or modes of operation, and a decoupling switch connected to the common output port at a first terminal of the decoupling switch and configured to connect the first terminal to any one of a second terminal of a plurality of second terminals of the decoupling switch, wherein each of the two or more power amplifier units comprises: an RF amplifier comprising: an output port in correspondence of an output transistor of the RF amplifier, wherein the output port is operatively coupled to a second terminal of the plurality of second terminals of the decoupling switch; an input port in correspondence of an input transistor of the RF amplifier, wherein the input port is connected to the input port of the each power amplifier unit, and an output match network coupled to the output port in correspondence of the output transistor at a first port of the output match network, and connected to a reference ground at a second port of the output match network, wherein a third port of an output match network of a power amplifier unit of the two or more power amplifier units is configured to provide an amplified version of an input RF signal to the power amplifier unit of the two or more power amplifier units.

BRIEF DESCRIPTION OF THE DRAWINGS

Like reference numbers and designations in the various drawings indicate like elements.

DETAILED DESCRIPTION

Figure 1:
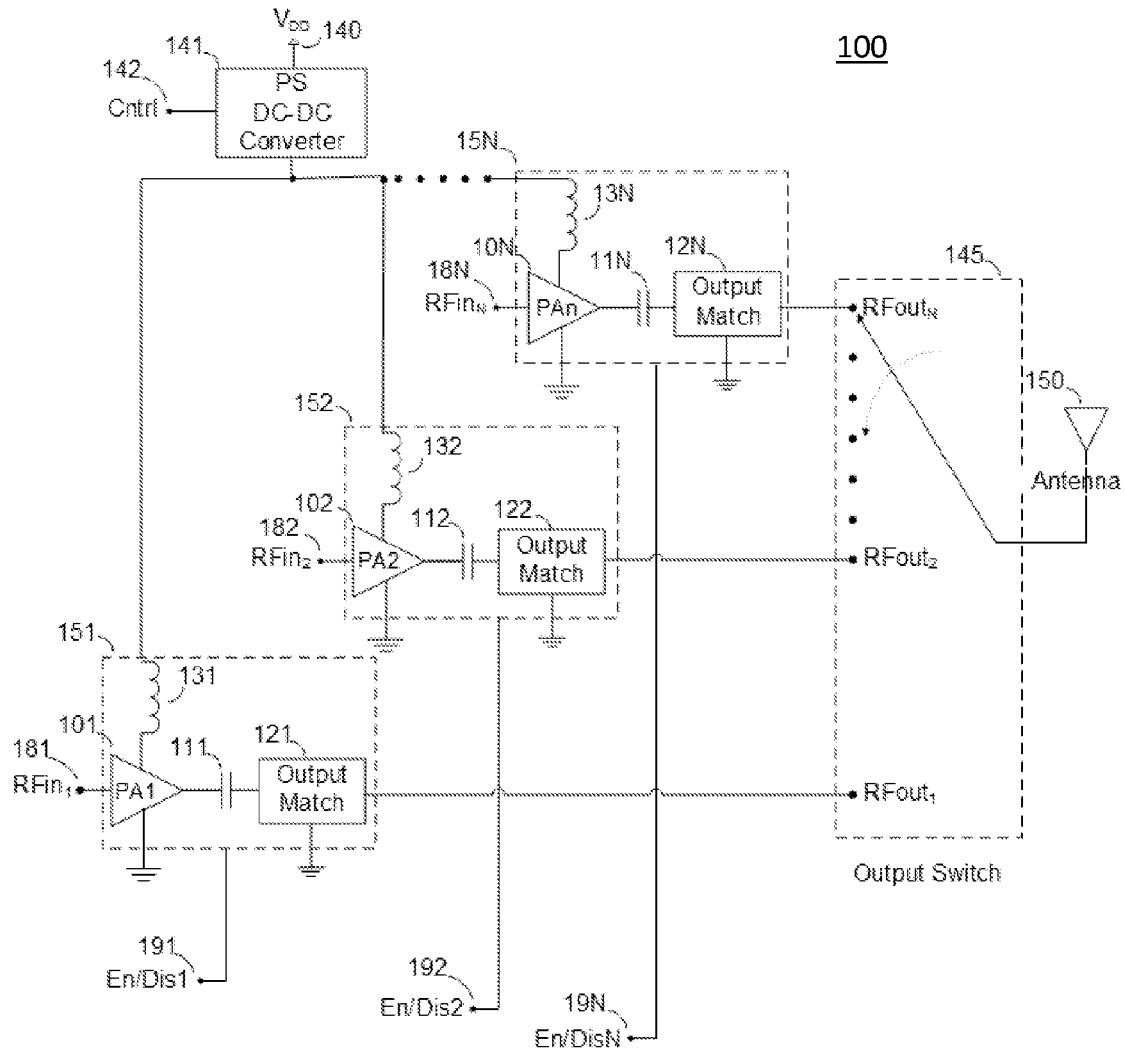
FIG. 1 shows a prior art exemplary implementation of a multiple band RF power amplifier system wherein a common power supply is used to supply power to multiple amplification units.

Throughout this description, embodiments and variations are described for the purpose of illustrating uses and implementations of the inventive concept. The illustrative description should be understood as presenting examples of the inventive concept, rather than as limiting the scope of the concept as disclosed herein.

As used in the present disclosure, the terms "switch ON", "turn ON" and "activate" may be used interchangeably and can refer to making a particular circuit element electronically operational.

As used in the present disclosure, the terms "switch OFF", "turn OFF" and "deactivate" may be used interchangeably and can refer to making a particular circuit element electronically non-operational.

As used in the present disclosure, the terms "amplifier" and "power amplifier" may be used interchangeably and can refer to a device that is configured to amplify a signal input to the device to produce an output signal of greater magnitude than the magnitude of the input signal.

As used in the present disclosure, the term "mode" can refer to a wireless standard and its attendant modulation and coding scheme or schemes. As different modes may require different modulation schemes, these may affect required channel bandwidth as well as affect the peak-to-average-ratio (PAR), also referred to as peak-to-average-power-ratio (PAPR), as well as other parameters known to the skilled person. Examples of wireless standards include Global System for Mobile Communications (GSM), code division multiple access (CDMA), Worldwide Interoperability for Microwave Access (WiMAX), Long Term Evolution (LTE), as well as other wireless standards identifiable to a person skilled in the art. Examples of modulation and coding schemes include binary phase-shift keying (BPSK), quadrature phase-shift keying (QPSK), quadrature amplitude modulation (QAM), 8-QAM, 64-QAM, as well as other modulation and coding schemes identifiable to a person skilled in the art.

As used in the present disclosure, the terms "channel" and "band" are used interchangeably and can refer to a frequency range. More in particular, the terms "channel" and "band" as used herein refers to a frequency range that can be defined by a wireless standard such as, but not limited to, wideband code division multiple access (WCDMA) and long term evolution (LTE). As is well known, adjacent channel leakage ratio (ACLR) provides a ratio of adjacent channel power to main channel power. For instance, in WCDMA, a channel bandwidth is 5 MHz. If power is to be transmitted on/within a main channel of 1925 MHz to 1930 MHz, adjacent channels would encompass 5 MHz below the main channel (i.e. 1920 MHz to 1925 MHz) and 5 MHz above the main channel (i.e. 1930 MHz to 1935 MHz), and the ACLR will be ratio of power leaked into one or the other adjacent channel to power in the main channel (e.g. ACLR (low) will refer to a ratio using the power leaked into the lower adjacent channel). Consequently, the ACLR can be utilized as a measure of linearity of a device.

As used in the present disclosure, the term "IC" can refer to an integrated circuit or monolithic integrated circuit composed of a set of electronic circuits on one small plate ("chip") of semiconductor material such as silicon. An IC can also be referred to as a "chip" or a "microchip". The set of electronic circuits within an IC are typically made of a very large number of transistors and other electronic components, which may need supply power (e.g. positive supply and negative supply) to operate.

As used in the present disclosure, the term "reactive network" can refer to a network comprising one or more reactive elements (e.g. capacitors or inductors).

As used in the present disclosure, the term "parallel reactive network" can refer to a reactive network comprising two or more branches that are connected in parallel, each branch comprising one or more reactive elements connected in series.

As used in the present disclosure, the term "series reactive network" can refer to a reactive network comprising one or more reactive elements that are connected in series.

As used in the present disclosure, the term "tunable capacitor" can refer to a capacitor whose capacitance value can be adjusted during circuit operation.

As used in the present disclosure, the term "digitally tunable capacitor" can refer to a tunable capacitor whose capacitance value can be adjusted by a digital signal during circuit operation. Examples of digitally tunable capacitors are described, for example, in U.S. Patent Publication No. 2011/0002080 A1, "Method and Apparatus for Use in Digitally Tuning a Capacitor in an Integrated Circuit Device", published on Jan. 6, 2011, which is incorporated by reference herein in its entirety.

As used in the present disclosure, the term "digitally tunable inductor" can refer to a tunable inductor whose inductance value can be adjusted by a digital signal during circuit operation. Examples of digitally tunable inductors are described, for example, in U.S. patent application Ser. No. 13/595,893 entitled "Method and Apparatuses for Use in Tuning Reactance in a Circuit Device", filed on Aug. 27, 2012, which is incorporated by reference herein in its entirety.

As used in the present disclosure, the term "couple" can refer to a degree by which various electronic components affect each other, without being necessarily physically connected. For example, a capacitor connected in series with a resistor at the output (terminal) of an amplifier, the resistor being connected to the amplifier and the capacitor being connected to ground, the capacitor will affect an output signal generated by the amplifier. This capacitor is coupled to the output of the amplifier. In some cases, coupling can be used within the context of an entire circuital arrangement, for example an amplifier fitted with an output filter containing various components. If all the components of the filter provide a contribution to the filter response, thus affect the output signal of the amplifier to provide a modified signal at the output of the arrangement, then, as used in the present disclosure, all the filter components are coupled to the amplifier output.

As used in the present disclosure, the term "decouple" can refer to a lack of any affect or influence between various electronic components, even if some of these components are physically connected. For example, a capacitor connected to an output (terminal, port) of an amplifier, with one side directly connected to the amplifier output and the other side connected to ground, is coupled to the amplifier and will affect an output signal generated by the amplifier. Removing the ground connection of the capacitor will remove the electrical influence of the capacitor over the output signal as the latter will become completely independent of the capacitor, although still physically connected to it. In this case, the capacitor is decoupled from the amplifier (output). Using the example provided above of the circuital arrangement, a filter component that does not affect the response of the filter, and thus does not affect the output signal of the amplifier, as used in the present disclosure is said to be decoupled from the amplifier output.

FIG. 1 shows a circuital arrangement (100) which can be used for RF transmission of multiple modes and multiple frequency bands signals. In the circuital arrangement (100), a plurality (e.g. 2, 3, 4, etc.) of amplification modules (152, 152, ..., 15N) are used to each transmit a signal of a specific mode and frequency band. For example, amplification module (151, 152, ..., 15N) transmits an amplified version signal ($RF_{out1}$, $RF_{out2}$, ..., $RF_{outN}$) of an input signal ($RF_{in1}$, $RF_{in2}$, ..., $RF_{inN}$) to an antenna (150) via an output selection RF switch (145). Under control of a controller unit (not shown in FIG. 1) which is aware of a desired mode and frequency band of operation of the circuital arrangement (100), the output selection RF switch (145) is configured to route the desired output signal to the antenna (150). In an exemplary case, such controller unit can be a transceiver unit used in standard hand held instruments, such as cell phones, tablets and personal digital assistants (PDAs).

Supply (e.g. voltage, current) to the various amplification modules (151, 152, ..., 15N) of the circuital arrangement (100) of FIG. 1 is provided via a power supply (141) which is powered by a system reference voltage $V_{DD}$ (140). The power supply (141) can be a DC-DC power supply configured, for example, to translate the voltage level $V_{DD}$ (140) to a level (e.g. voltage and current) adapted to the power supply requirement of the various components of the amplification modules. In some exemplary embodiments the power supply (141) can be a variable power supply, with an output voltage dependent on a control signal Cntrl applied to a corresponding control terminal (142) as depicted by FIG. 1. According to some embodiments, such control signal (Cntrl) is adapted to modulate (e.g. time varying amplitude) the output of the power supply (141) at rates (e.g. frequency) close to an envelope of the amplitude of an RF signal being transmitted by an amplification module (151, 152, ..., 15N) and can contain adjustments (e.g. amplitude, frequency) such as to optimize operation of an activated amplification module (e.g. for a specific mode of operation and frequency band). According to some exemplary embodiments, the output signal of the variable power supply can be an amplified version (e.g. power, voltage, current) of the control signal Cntrl. Modulation of the power supply output to an amplifier, including methods to optimize operation of the amplifier, is described, for example, in the U.S. patent application Ser. No. 13/829,946, entitled "Amplifier Dynamic Bias Adjustment for Envelope Tracking", filed on Mar. 14, 2013, which is incorporated herein by reference in its entirety.

With continued reference to FIG. 1, each of the amplification module (151, 152, ..., 15N) can be activated/deactivated (e.g. ON/OFF) via a corresponding control signal (En/Dis1, En/Dis2, ..., En/DisN) applied to corresponding control terminal (191, 192, ..., 19N) which can also be generated, for example, by the same controller unit controlling the configuration of the switch (145). Being aware of a desired mode and frequency band of operation, the controller unit sets corresponding control signals to activate a corresponding amplification module (e.g. 151) and route a corresponding amplified output signal to the transmission antenna (150), while disabling other amplification modules (e.g. 152, ..., 15N). In a typical operation of the circuital arrangement (100), only one amplification module is activated (e.g. ON) during a transmission, although in some exemplary cases, several concurrent transmissions may be desired and obtained via redundant circuital arrangements (100) operating in parallel, each having one amplification module activated.

Figure 2:
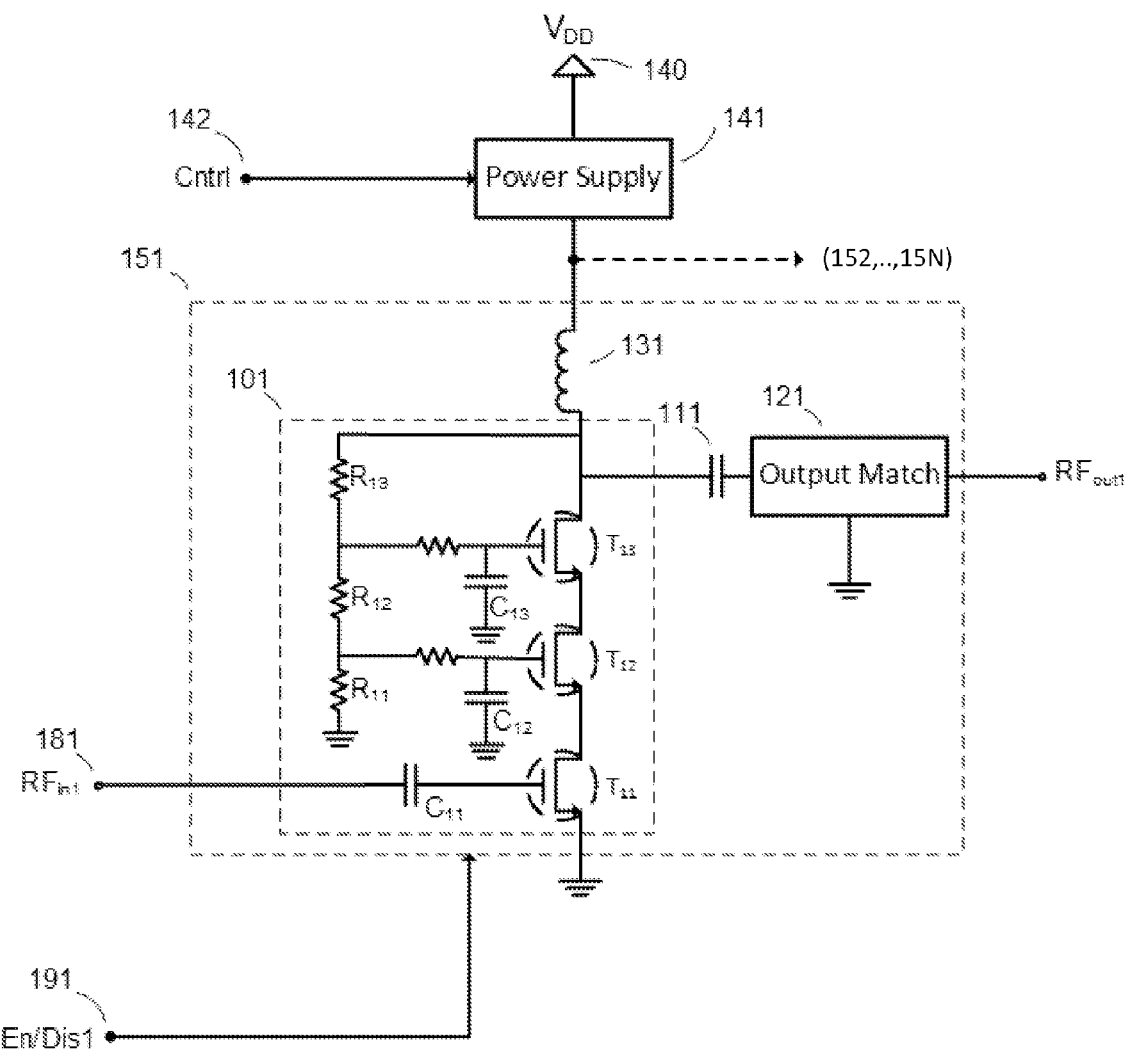
FIG. 2 shows an exemplary embodiment of an amplification unit comprising an RF power amplifier and an output match, used in the various embodiments according to the present disclosure.

FIG. 2 shows an exemplary embodiment of an amplification module (151) of the plurality of amplification modules of FIG. 1. Amplification module (151) of FIG. 2 comprises an amplifier (101) with an input terminal (181) to which an input signal (RFin1) of the amplification module (151) feeds. Via the input terminal (181) and through a decoupling capacitor (C11), an AC coupled version of the input signal (RFin) is fed to a gate of an input (FET) transistor (T11) of the amplifier (101). The amplifier (101) comprises a stacked arrangement of transistors (T11, ..., T13, ...) to create a cascode configuration, known to the person skilled in the art. In this configuration, the first input transistor (T11) provides a high input impedance to the input signal (RFin1), while the remainder transistors (T12, ..., T13, ...) provide a gain stage for the amplifier. A drain of an output transistor (T13) of the amplifier (101) is connected to the power supply (141) through an RF choke (e.g. inductor 131).

Although the amplifier (101) is depicted as a cascode type amplifier comprising a plurality of FET transistors (T11, T12, T13, ...), a person skilled in the art will realize that the amplifier (101) can also represent a final stage amplifier from among a plurality of cascaded amplifiers, each comprising one or more transistors (e.g. cascade, cascode, stacked, and so on) that construct the amplifier. Furthermore, a person skilled in the art will realize other types of active semiconductor devices (e.g. silicon PMOS FET, NMOS FET, BJT, GaAs FET, HEMT, HBT, GaN FET, and so on) can also be used in designing and constructing the amplifier (101). In some embodiments the amplifier (101) can be a scalable periphery amplifier, composed of stacked unit cells in a parallel configuration, each unit cell being an amplifier, and switches configured to activate/deactivate the unit cells according to some desired mode of operation. More information on scalable periphery amplifiers and related output matches can be found, for example, in U.S. patent application Ser. No. 13/797,779, entitled "Scalable Periphery Tunable Matching Power Amplifier", filed on Mar. 12, 2013, which is incorporated by reference herein in its entirety.

With continued reference to FIG. 2, an output signal of the amplifier (101) is provided through the drain of the output transistor (T13), and fed to an output match circuit (121) through a decoupling (e.g. DC blocking) capacitor (111). The output match (121) can provide an efficient transfer of power between the output stage of the amplifier (101) and a next stage coupled to the amplification arrangement (151), such as the antenna (150) of FIG. 1. Such output match can provide a desired impedance match between the two connecting stages (amplifier and antenna) and/or a harmonic termination (e.g. even and/or odd harmonics) such as to shape an output signal of the amplifier (101). Although not shown in FIG. 2, the output match can comprise a plurality of tunable reactive components arranged in one or more parallel and/or series reactive networks connected to each other, controlled via a control signal generated, for example, by the same controller unit that generates the activation/deactivation control signal (191) of the amplification unit (151). In some embodiments, the same control signal (191) can comprise a dedicated control for the configuration of the output match (121). More information on tunable matching networks and harmonic termination can be found in, for example, U.S. Pat. No. 7,795,968, entitled "Power Ranging Transmit RF Power Amplifier", issued Sep. 14, 2010, and U.S. patent application Ser. No. 13/797,686, entitled "Variable Impedance Match and Variable Harmonic Terminations for Different Modes and Frequency Bands", filed on Mar. 12, 2013, both of which are incorporated herein by reference in their entirety.

The output match circuit (121) of FIG. 1 thus provides an output signal (RFout1) of the amplification unit (151) which is an amplified version of the input signal (RFin1) of the amplification unit (151), and optimized for transmission through the next stage (e.g. antenna 150).

As shown in FIG. 2, biasing of the cascode stage transistors (T12, T13, . . . ) is provided via a resistive voltage divider network (R11, R12, R13 . . . ) coupled to the power supply (141). The resistive divider network (R11, R12, R13 . . . ) may be used to regulate the DC bias voltage output by the power supply (141) to the gates of the second FET (T12), the third FET (T13), . . . , in such a way that the applied DC bias at the gate terminals of FETs (T12, T13, . . . ), can result in a desired division of an output RF voltage swing at the drain terminal of the output transistor (e.g. T13), between the transistors (T11, T12, T13, . . . ) of the amplifier (101). Capacitors C12, C13 may be correspondingly connected at the gate terminals of the second FET transistor (T12) and the third FET transistor (T13) to the ground to bypass noise and shunt any voltage/current spikes to the ground. It should be noted that although the various figures of this disclosure show a reference ground for a return current path, in general such reference can effectively be a reference potential, such as a system reference ground, an RF (e.g. AC) ground or a virtual ground, all of which the skilled person is well aware of. Therefore the reference ground (e.g. ground) as used in this disclosure and figures should not be regarded as limiting the scope of the invention as disclosed herewith, but rather as an exemplary reference potential. The gate capacitors (C12, C13) of FIG. 2 can allow gate voltages (voltage across the respective gate capacitor) of the second FET (T12) and the third FET (T13), respectively, to float, that is let the gate voltages vary along with the RF signal at the drain of the corresponding FETs (T12, T13), which consequently allow control (e.g. evenly distribute) of the voltage drop across the two transistors for a more efficient operation of the two transistors. See for example, U.S. Pat. No. 7,248,120, issued on Jul. 24, 2007, entitled "Stacked Transistor Method and Apparatus", which is incorporated herein by reference in its entirety.

In the exemplary case depicted by FIG. 2 where the power supply output varies (e.g. modulated, time-varying output) under control of a signal fed to its input control terminal (142), accordingly the biasing of the transistors (T12, T13, . . . ) also varies such as to provide a consistent output characteristic of the amplifier (101) as described in details in the referenced U.S. patent application Ser. No. 13/829,946. Such dynamic biasing of the various transistors of the amplifier (101) allows for better amplifier output signal characteristics, as measured for example by linearity, efficiency and adjacent channel leakage ratio (ACLR) of the amplifier, for the case where the output transistor (T13) has a varying (e.g. dynamically with respect to time) supply power.

Figure 3A:
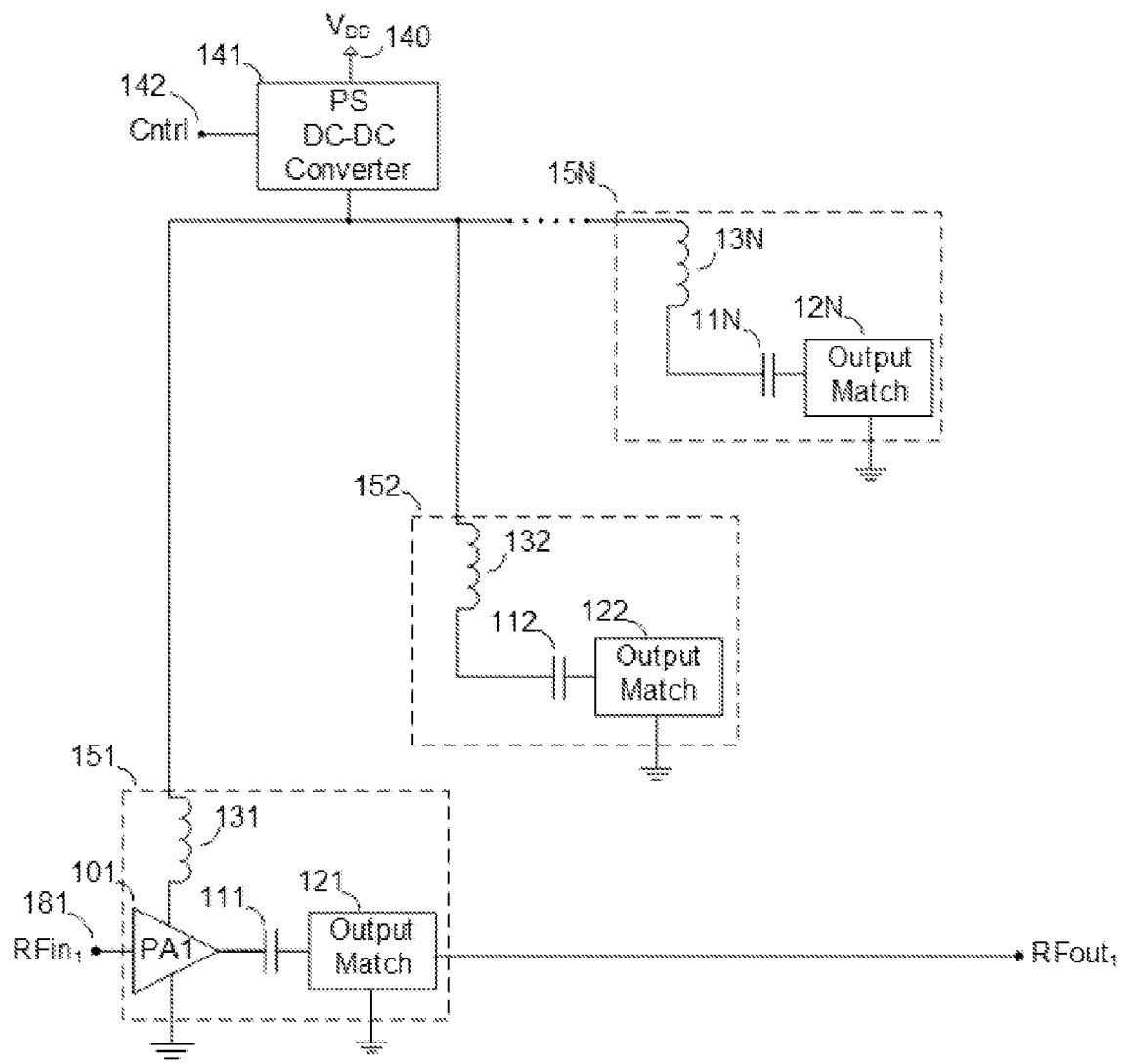
FIG. 3A shows a load to the power supply of FIG. 1 in the case where one of the multiple amplification units is transmitting.
Figure 3B:
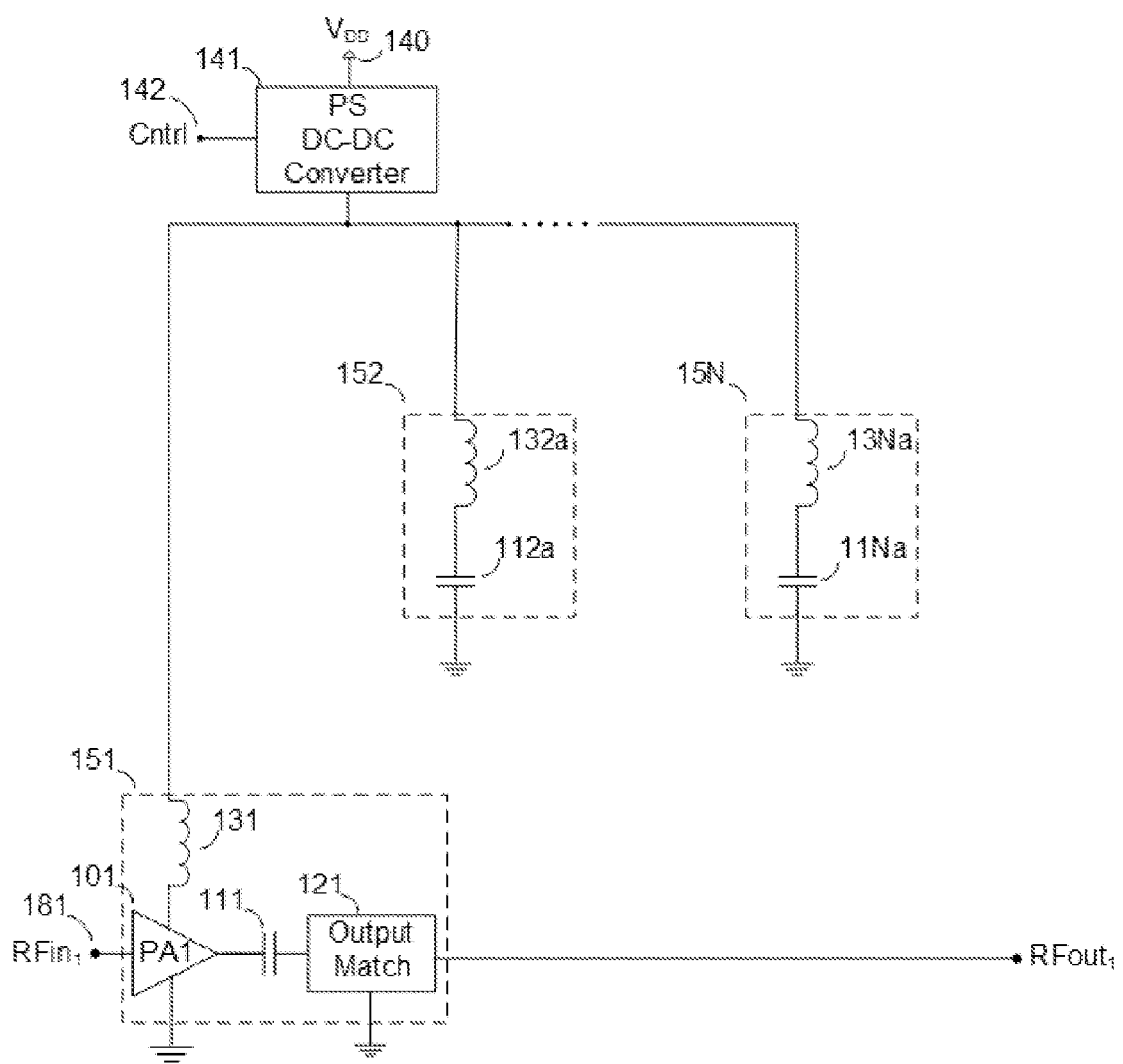
FIG. 3B shows an equivalent representation of the load to the power supply shown in FIG. 3A.

Assuming the exemplary case depicted by FIG. 3A where the amplification unit (151) is configured for transmission and thus activated via a corresponding configuration control signal (e.g. activation and output match configuration), the remainder deactivated amplification units (152, 153, . . . , 15N) of FIG. 1 are configured such as there is no current (e.g. from the power supply unit) flowing through their corresponding amplifiers (102, . . . , 10N). In this case and as depicted by FIG. 3A, an equivalent current flowing circuital representation of the deactivated amplification units (152, 153, . . . , 15N) can comprise the RF choke (132, . . . , 13N) in series connection with the decoupling capacitor (112, . . . , 11N) and a path of the output match (122, . . . , 12N) coupled to ground (e.g. reference potential). In general, the equivalent current flowing circuital arrangement can be reduced to the circuit represented in FIG. 3B, corresponding to a series connected inductor (132a, . . . , 13Na) and capacitor (112a, . . . , 11Na) coupled to ground, which provide a conduction path to a current from the power supply (141) to ground. As known by the skilled person, such equivalent capacitance represented by capacitor (112a, . . . , 11Na) represents a parasitic influence to the operation of the power supply (141) via its capacitive loading effect of the power supply (e.g. loading of a corresponding output signal of the power supply unit). Such parasitic capacitive load can in turn influence (e.g. reduce) the bandwidth of the output signal provided by the power supply (141) to the transmitting amplification unit (151) and thereby similarly influence the operation of the amplification unit (151), such as reduce a corresponding output linearity, efficiency and/or ACLR. In some cases, a combination of such parasitic capacitance with an inductor (e.g. 132a, . . . , 13Na of FIG. 3B) coupled to the parasitic capacitance can create a parasitic load at the output of the power supply (141). Such parasitic load can present a very low impedance at a frequency of operation of the power supply (141), thus affecting output of said power supply.

With continued reference to FIG. 3A, according to one embodiment of the present disclosure, a parasitic load, such as the parasitic capacitive loading presented by a deactivated amplification unit (152, . . . , 15N), can be reduced in the case where the output match circuit (122, ..., 12N) comprises variable capacitors, such as DTCs for tunability of the output match circuit. In this case, reducing a capacitance value of such variable capacitor to a minimum value can reduce its contribution to the parasitic coupling of a corresponding deactivated amplification unit.

Figure 4:
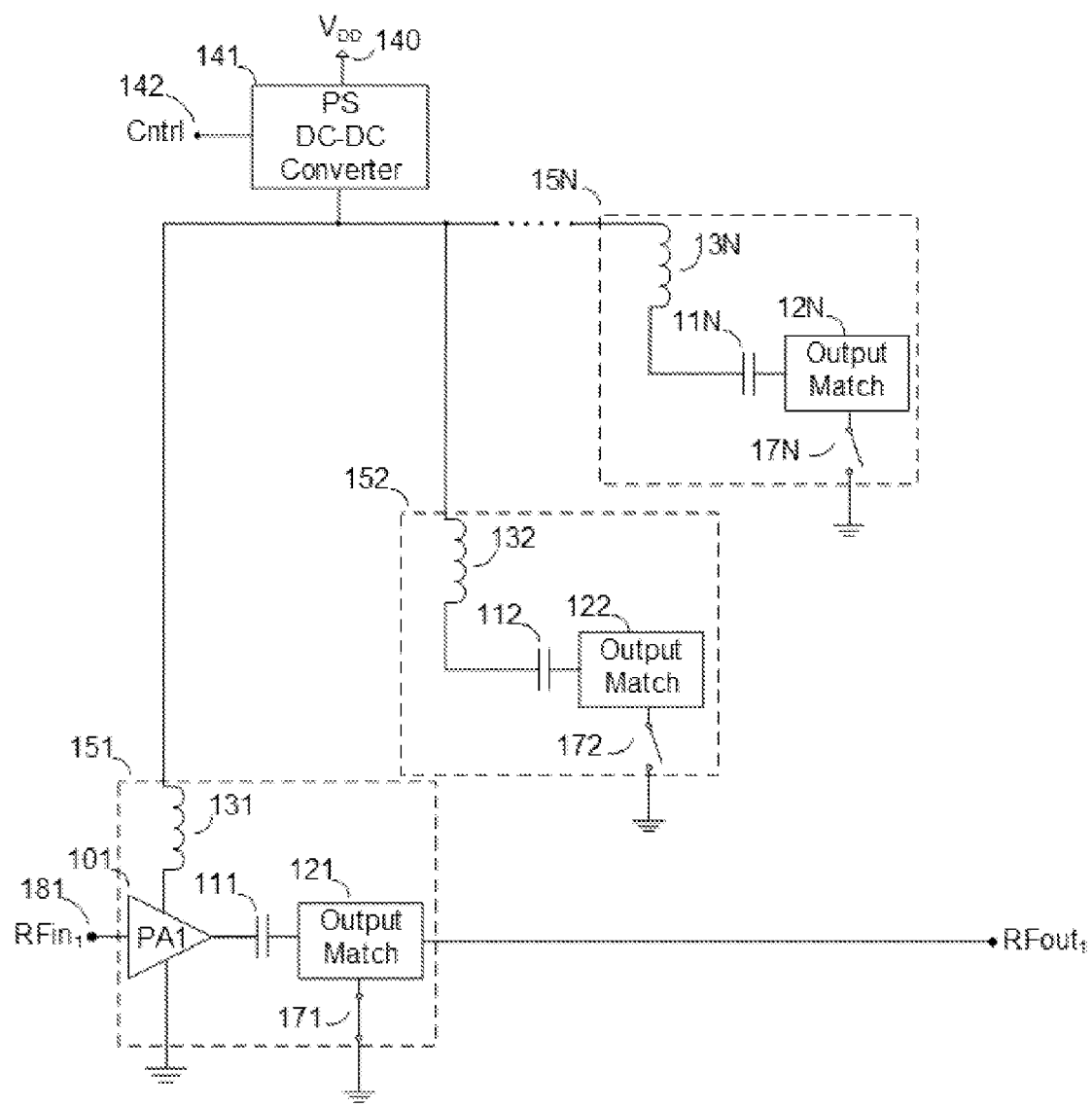
FIG. 4 shows an embodiment according to the present disclosure wherein one or more switches are used to decouple parasitic loads to the power supply of the multiple band RF power amplifier system of FIG. 1.

According to a further embodiment of the present disclosure, a method for reducing (e.g. removing) the influence of a parasitic load, such as the parasitic capacitive loading previously discussed, of the deactivated amplification units of FIG. 1 is depicted by FIG. 4. In the embodiment according to FIG. 4, decoupling switches (171, 172, ..., 17N) associated to the amplification units (151, 152, ..., 15N) are used to selectively decouple a conduction path to ground in correspondence of a deactivated amplification unit through a corresponding parasitic capacitor. In the exemplary ease depicted by FIG. 4, the decoupling switch (171) of the active amplification unit (151) is closed, such as to provide normal operation and ground connection to the output match circuit (121), whereas decoupling switches (172, ..., 17N) in correspondence of the deactivated amplification units (152, ..., 15N) are open, such as to prevent a current to flow from the power supply (141) output through a conduction path of the deactivated amplification units (152, ..., 15N).

In the embodiment according to FIG. 4, controlling of the switches (171, 172, ..., 17N) can be performed by same signal (En/Dis1, En/Dis2, ..., En/DisN) used for activating/deactivating the amplification units (151,152, ..., 15N). In some embodiments, a different signal can be used. In general, control signals to control the various configuration elements of each amplification unit can be referred to as amplification configuration control, and can generally be generated by a same controller unit, such as a transceiver, used to control the output selection RF switch (145) of FIG. 1.

With reference to the embodiment shown in FIG. 4, the decoupling switch (171,172, ..., 17N) can be a stacked switch (e.g. a switch comprising stacked transistors, a stacked transistor switch) in order to allow power handling capability greater than a power handling capability of a switch comprising a single transistor, because a voltage present across the switch (e.g. in an open state) may be sufficiently high such as to damage a switch comprising a single transistor. Reference can be made for example to U.S. Pat. No. 7,910,993 B2, issued on Mar. 22, 2011, entitled "Method and Apparatus for Use in Improving Linearity of MOSFETs Using an Accumulated Charge Sink", and U.S. Pat. No. 8,129,787 B2, issued on Mar. 6, 2012, entitled "Method and Apparatus for Use in Improving Linearity of MOSFETs Using an Accumulated Charge Sink", both of which are incorporated herein by reference in their entirety.

Figure 5:
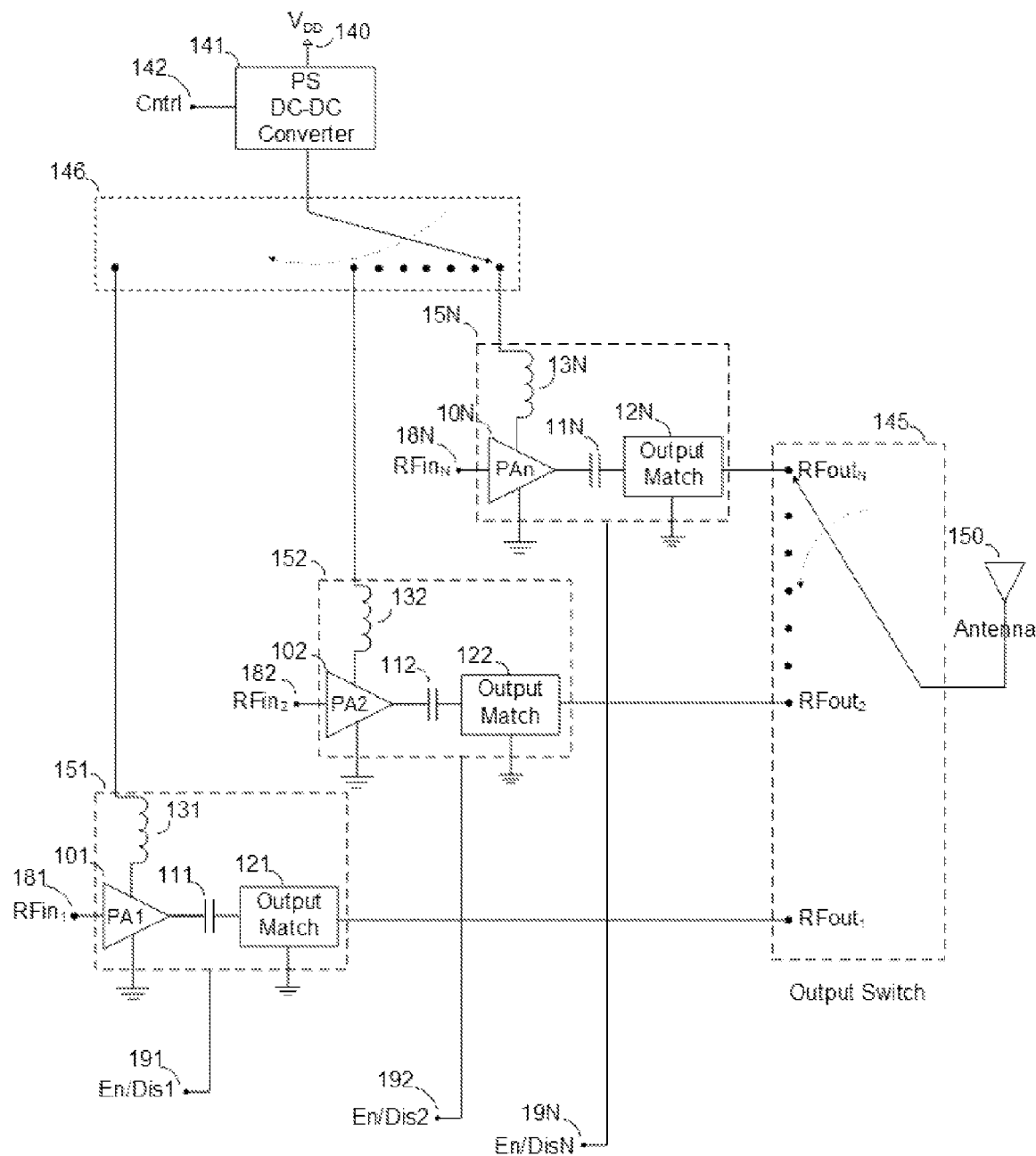
FIG. 5 shows an embodiment according to the present disclosure wherein a switch is used to provide a supply only to a transmitting amplification unit.

According to a further embodiment of the present disclosure as depicted by FIG. 5, a supply switch (146) is provided (e.g. to the circuit 100 of FIG. 1) such as to entirely disconnect deactivated amplification units (151, 152, ..., 15(N−1)) from the power supply unit (141) and only connects an activated amplification unit (15N) to the power supply unit (141). In the embodiment according to FIG. 5, by virtue of being entirely disconnected from the power supply (141), a deactivated amplifier (151, 152, ..., 15(N−1)) does not present any parasitic (e.g. capacitive) influence to the output of the power supply. However, the introduction of the supply switch (146) can introduce an added resistance in the conduction path to supply input of the activated amplification unit (15N). Such resistive loading can affect a supply voltage level to the activated amplification unit (15N) which in most cases is small enough as to not affect output quality of the amplification unit substantially. According to some embodiments of the present disclosure, such small resistive loading effects corresponding to the activation of an amplification unit (e.g. series switch resistance) can be compensated by adjusting power supply output level accordingly, using the control signal (Cntrl) fed to the corresponding control terminal (142) of the power supply unit (141). This method is further described in the following paragraphs.

With further reference to the embodiment according to FIG. 5, the supply switch (146) can be activated by a configuration control signal generated, for example, by the same controller unit generating controls for the output RF switch (145). The supply switch (146) of FIG. 5 can comprise a plurality of switches configured to provide the desired functionality, that is, selection of one input (e.g. connection to one amplification unit) from many. According to some exemplary embodiment of the present disclosure, the supply switch (146) can comprise a plurality of switches in a parallel configuration, each being connected to the common output port of the power supply unit on one side of the switch, and to a power supply input port of each amplification unit (151, 152, ..., 15N) on the other side of the switch. The skilled person will readily know of various alternative arrangements to produce equivalent switch functionality to the switch (146) depicted in FIG. 5, and will be able to use such alternative arrangements in the teachings according to the various embodiments presented in the disclosure. Due to reasons previously mentioned in the present disclosure, each of the plurality of switches can be a stacked transistor switch.

Although the plurality of amplification units (151, 152, ..., 15N) of FIG. 1 are made of similar elements, such, for example, as depicted by FIG. 2, due to board layout, manufacturing tolerances and/or possible requirement for different device sizes in the various amplification units, each amplification unit (151, 152, ..., 15N), in its activated state, can present a different load to the power supply unit (141). Such difference in loading can therefore affect a characteristic of the output supply, such as an amplitude and/or frequency component of the output supply (e.g. voltage) provided by the power supply unit (141) to the activated amplification unit. It follows that according to an embodiment of the present disclosure, such influence on a characteristic of the output supply, such as amplitude and/or frequency of the output supply, by a load of an activated amplification unit can be compensated for by changing an output characteristic (e.g. frequency, voltage) of the power supply unit (141) as a function of the activated amplification unit. Such compensation can be built into the control signal (Cntrl) fed to the corresponding control terminal (142) of the power supply unit (141) which can shape (e.g. dynamically) the output of the power supply unit when subjected to different loads (e.g. from activated amplification units).

Figure 6:
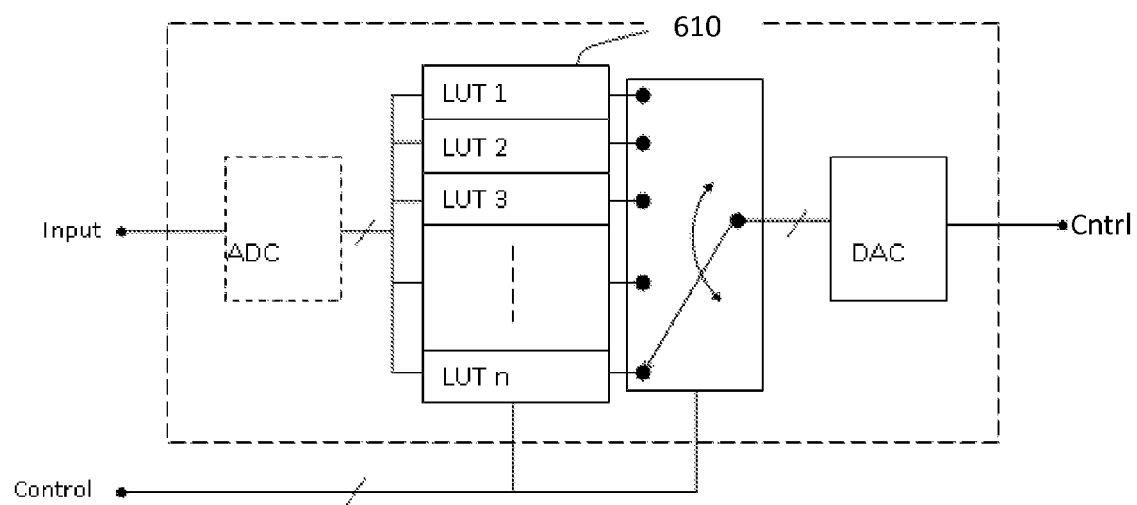
FIGS. 6-8 show exemplary embodiments according to the present disclosure of load compensation control circuits.
Figure 7:
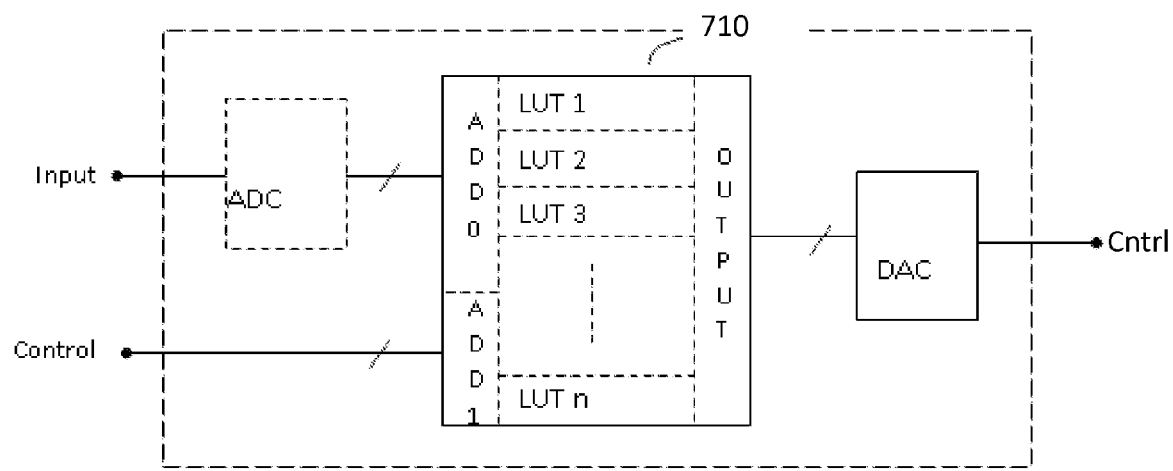
Figure 8:
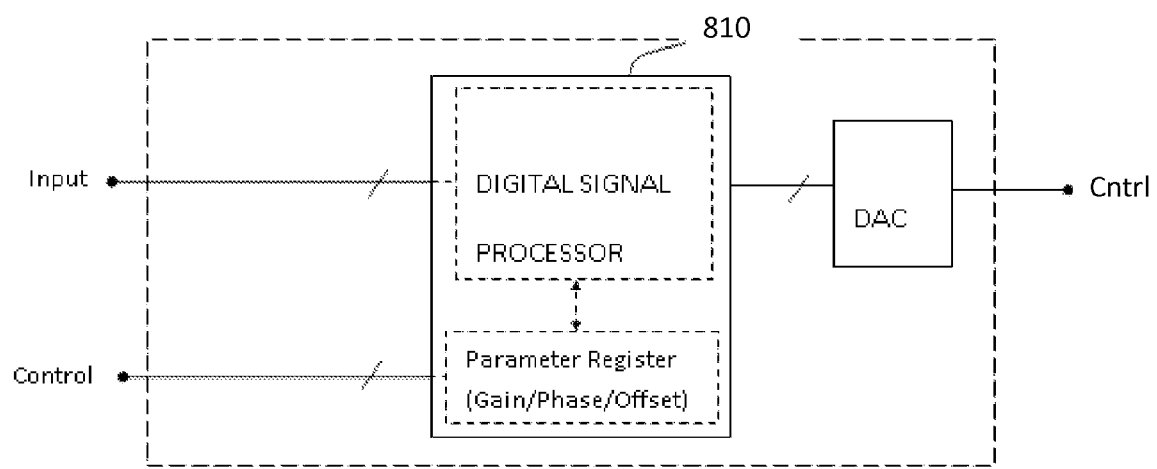

FIGS. 6-8 show various exemplary embodiments according to the present disclosure of circuits adapted to provide load compensation control to the power supply unit (141) (e.g. to control terminal 142), such as to compensate for a difference in a load presented to said power supply. According to the various exemplary embodiments presented in FIGS. 6-8, an analog or digital input signal (Input) is processed according to a processing defined by a control signal (Control) to generate an output signal (Cntrl) fed to the control terminal (142) of the power supply unit (141) (e.g. of FIGS. 1-5). In the exemplary embodiments shown in FIGS. 6-8, the control signal (Control) can be dependent on an activated/deactivated state of an amplification unit (151, 152, ..., 15N) and generated, for example, by the same controller unit (e.g. a transceiver) used to generate the various control and configuration signals used in the various embodiments presented by FIGS. 1-5. It should be noted that with reference to the various embodiments according to the present disclosure, generally only one of the multiple amplification units (151, 152, ..., 15N) is active (e.g. activated, ON, and associated to a desired mode of operation and/or frequency band) and therefore the remainder amplification units are deactivated (e.g. OFF). Therefore, specifying an active amplification unit is sufficient to provide the required load compensation characteristic (e.g. based on the various loads presented to the power supply unit 141), which can be function of the specified active amplification unit and/or of the remainder inferred deactivated amplification units. Such load compensation characteristic can then be used to generate and/or adjust the output signal (Cntrl) of FIGS. 6-8.

With reference to FIG. 6, the control signal (Control) selects one of several lookup tables (LUT1, LUT2, ..., LUTn) of the compensation processing unit (610) for processing the input signal, latter signal optionally being digitized (e.g. via an input analog-to-digital ADC converter of FIG. 6 surrounded by dotted lines) if provided in an analog form. Such lookup tables can be shaping tables such as to shape (e.g. filter, emphasize, de-emphasize, delay, pre-distort, etc . . . ) the input signal in a way to produce the output signal (Cntrl) that when fed to the control terminal (142) of the power supply unit (141), is adapted to dynamically optimize operation of an activated amplification module (e.g. for a specific mode of operation and/or frequency band), such as described, for example, in the referenced U.S. patent application Ser. No. 13/829,946. In other words, the selected lookup table is associated to a selected amplification module and a desired mode and/or frequency band of operation.

According to further embodiments of the present disclosure, a selected lookup table can also contain compensation parameters (e.g. built into the shaping tables) such as to dynamically compensate a characteristic of the power supply unit (141) output being affected by a load of an amplification unit (151, 152, ..., 15N). It should be noted that the shaping tables referred herewith can also be referred to as mapping tables, such as to map an input signal to an output signal using the mapping table, latter table containing a desired mapping function, as further described in U.S. patent application Ser. No. 13/829,946. A dynamic compensation refers to one that can provide corrections (e.g. amplitude, phase, offset) in real time and based on a frequency content of the input signal Input to the load compensation control circuit of FIG. 6. For example, if a parasitic load is presented which loads the output of the power supply (e.g. 141 of FIGS. 1 and 5) at one narrow frequency band, the compensation processing unit (610) can shape (e.g. map) the Input signal (e.g. digital representation of the Input signal) such as to obtain a Cntrl signal which when fed to the control terminal (142) of the power supply unit (141), such narrow band impact of the parasitic loading on the output of the power supply is suppressed while maintaining an optimized operation of an activated amplification module with respect to a mode and/or frequency band of operation. According to some embodiments of the present disclosure, the output of the power supply unit is an amplified and high power version of the Cntrl signal fed to the control terminal (142) of the power supply unit. More information about dynamically controlling the output power (e.g. signal) of the power supply unit (140) can be found in the referenced U.S. patent application Ser. No. 13/829,946.

FIG. 7 represents another possible exemplary implementation for generation of a load compensation control signal to be fed to the control terminal (142). In the exemplary case of FIG. 7, the compensation processing unit (710) comprises a single combined lookup table (e.g. EPROM) containing the various shaping tables of FIG. 6 selected by an input address comprising the digitized input signal (Input) and the digital control signal (Control). In the embodiment according to FIG. 7, the output selection switch provided in FIG. 6 is not required.

Finally, in the embodiment according to FIG. 8, the compensation processing unit (810) comprises a single digital signal processor to generate the control signal (e.g. for load compensation control) for the power supply (141), based on a set of parameters which can define, for example, processing of a gain, phase and offset of the input signal (Input) to the circuit of FIG. 8.

The input signal (Input) of FIGS. 6-8 can be considered as a nominal control signal (Cntrl) to the power supply (141) of FIGS. 1-5 to produce a nominal supply voltage for a nominal operation of an amplification unit presenting a nominal load to the power supply. The load compensation control circuits of FIGS. 6-8 via corresponding compensation processing units (610, 710, 810) of FIGS. 6-8, can be considered as performing the required processing to the input signal (Input) to provide a compensated control signal (Cntrl) to the power supply (141) such as to output the nominal supply voltage in the case where a presented load is not nominal while maintaining an optimal operation of a selected amplification unit with respect to a desired mode and/or frequency band of operation. The presented load can be the load of an activated amplification unit while the deactivated units are either decoupled from an output of the power supply (141) or their parasitic loading reduced as per the various embodiments of this disclosure.

According to a further embodiment of the present disclosure, the compensation control units of FIGS. 6-8 can compensate for any load difference from the nominal load as a result of a combination of a load from an activated amplification unit (151, 152, . . . , 15N) and the loads from the remainder coupled deactivated amplification units, such as represented in FIG. 1.

According to further embodiments of the present disclosure, monolithic integration of any of the presented circuital arrangements (e.g. FIGS. 1-8) a using a process such as CMOS, CMOS silicon on insulator (SOI), or CMOS silicon on sapphire (SOS) is provided. Benefits of SOI and SOS processes include lower parasitic capacitance and thus higher linearity for stacked switches and transistors implemented using such processes, as well as high transistor stack capability (e.g. 3, 4 or greater) and higher breakdown voltages for larger voltage swings. Additional benefits of the SOI and SOS processes are lack of p-n junction diode which allows for better output linearity over a wider output signal range. Although in some embodiment full monolithic integration is performed, according to further embodiments of the present disclosure, partial monolithic integration may be performed, wherein for example some components of the various arrangements disclosed are not monolithically integrated. The skilled person can envision multitude ways of partitioning the arrangements according to the present embodiments for integration purposes and as fit by certain desired design criteria, while keeping the benefits of the presented embodiments.

The examples set forth above are provided to give those of ordinary skill in the art a complete disclosure and description of how to make and use the embodiments of the present disclosure, and are not intended to limit the scope of what the inventors regard as their disclosure. Modifications of the above described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. A circuital arrangement comprising:
   1) a power supply unit;
   2) a plurality of power amplifier units, each configured to receive power from a common output port of the power supply unit, each configured to amplify an input radio frequency (RF) signal at an input port of the each power amplifier unit in correspondence of a different frequency band and/or mode of operation of a plurality of different frequency bands and/or modes of operation, and each comprising:
      a) an RF amplifier comprising:
         i) an output port in correspondence of an output transistor of the RF amplifier, wherein the output port is operatively coupled to the common output port of the power supply unit;
         ii) an input port in correspondence of an input transistor of the RF amplifier, wherein the input port is connected to the input port of the each power amplifier unit, and
      b) an output match network coupled to the output port in correspondence of the output transistor at a first port of the output match network,
      wherein:
      during an activated state of the power amplifier unit, the output match network is coupled via a second port of the output match network to an output load of the circuital arrangement, and an amplified RF signal in correspondence of the input RF signal and a current flow from the power supply unit through the output transistor is provided to the output load, and
      during a deactivated state of the power amplifier unit, the output match network is decoupled from the output load of the circuital arrangement and no current flows from the power supply unit through the output transistor;
      and
   3) one or more decoupling circuits, wherein:
      during operation of the circuital arrangement, one or more of the plurality of power amplifier units are deactivated, each of the one or more decoupling circuits is configured to remove a loading effect of the one or more deactivated power amplifier units on the common output port of the power supply unit.

2. The circuital arrangement according to claim 1, wherein during operation of the arrangement only one power amplifier unit of the plurality of power amplifier units is activated, and wherein the activated power amplifier unit is in correspondence of a different frequency band and/or mode of operation of the plurality of different frequency bands and/or modes of operation.

3. The circuital arrangement according to claim 1, wherein a decoupling circuit of the one or more decoupling circuits comprises a switch configured to remove a current flow in a conduction path of an output match network during a deactivated state of a power amplifier unit of the one or more deactivated power amplifier units.

4. The circuital arrangement according to claim 1, wherein a decoupling circuit of the one or more decoupling circuits comprises a switch configured to remove a current flow through the output match network during the deactivated state of the power amplifier unit.

5. The circuital arrangement according to claim 3 or claim 4, wherein the switch is in series connection between a third port of the output match network and a reference ground, and wherein during the deactivated state of the power amplifier unit the switch effectively decouples the output match network from the reference ground.

6. The circuital arrangement according to claim 3 or claim 4, wherein the switch is in series connection between the common output port of the power supply unit and an input power port of each of the plurality of the power amplifier units.

7. The circuital arrangement according to claim 6, wherein during the deactivated state of the power amplifier unit, the switch disconnects the power supply unit from the power amplifier unit.

8. The circuital arrangement according to claim 3 or claim 4, wherein the switch is a stacked transistor switch.

9. The circuital arrangement according to claim 3 or claim 4, wherein the loading effect is in correspondence of a stray capacitance and/or inductance from the output match network.

10. The circuital arrangement according to claim 2, wherein the output match network comprises one or more digitally tunable capacitors (DTCs) and/or digitally tunable inductors (DTLs).

11. The circuital arrangement according to claim 10, wherein during the deactivated state of the power amplifier unit, a capacitance value of the one or more digitally tunable capacitors is set to a minimum value.

12. The circuital arrangement according to claim 1, wherein the power supply unit is a variable power supply unit configured to output a dynamic time varying output signal at the common output port of the power supply unit.

13. The circuit arrangement according to claim 12, wherein the dynamic time varying output signal is in correspondence of an output power control signal provided to an output power control port of the power supply unit.

14. The circuit arrangement according to claim 13, wherein the dynamic time varying output signal of the power supply unit is an amplified version of the output power control signal.

15. The circuit arrangement according to claim 13, wherein the output power control signal is configured to adjust the dynamic time varying output signal based on a loading characteristic of an activated power amplifier unit of the plurality of power amplifier units.

16. The circuit arrangement according to claim 13, wherein the output power control signal is configured to adjust the dynamic time varying output signal based on a loading characteristic of the one or more deactivated power amplifier units.

17. The circuit arrangement according to claim 13, further comprising a load compensation circuit, wherein the load compensation circuit is configured to provide the output power control signal to the output power control port of the power supply unit based on an input signal to the load compensation circuit.

18. The circuit arrangement according to claim 17, wherein the load compensation circuit is configured to adjust one or more of: a) a gain parameter, b) a phase parameter, and c) an offset parameter, in correspondence of the output power control signal.

19. The circuit arrangement according to claim 18, wherein the adjusting is in correspondence of an activated power amplifier unit in correspondence of a different frequency band and/or mode of operation of the plurality of frequency bands and/or modes of operation.

20. The circuit arrangement according to claim 19, wherein the adjusting comprises compensation of one or more of: a), b) and c) based on a loading characteristic of the one or more deactivated power amplifier units.

21. The circuit arrangement according to claim 19 or claim 20, wherein the load compensation circuit further comprises one or more lookup tables, wherein a lookup table of the one or more lookup tables is configured to map a digital representation of the input signal to the load compensation circuit to a digital representation of the output power control signal.

22. The circuit arrangement according to claim 18, wherein the load compensation circuit further comprises a digital signal processor adapted to generate a digital representation of the output power control signal based on a digital representation of the input signal to the load compensation circuit and a provided gain/phase/offset compensation parameter.

23. The circuital arrangement according to claim 1 or claim 17 monolithically integrated.

24. The circuital arrangement according to claim 1 or claim 17 fabricated entirely or partially on an integrated circuit using silicon on sapphire (SOS) or silicon on insulator technology (SOI).

25. A circuital arrangement comprising:
 1) a variable power supply unit;
 2) a plurality of power amplifier units, each configured to receive power from a common output port of the power supply unit, each configured to amplify an input radio frequency (RF) signal at an input port of the each power amplifier unit in correspondence of a different frequency band and/or mode of operation of a plurality of different frequency bands and/or modes of operation, and each comprising:
  a) an RF amplifier comprising:
   i) an output port in correspondence of an output transistor of the RF amplifier, wherein the output port is operatively coupled to the common output port of the power supply unit;
   ii) an input port in correspondence of an input transistor of the RF amplifier, wherein the input port is connected to the input port of the each power amplifier unit,
  and
  b) an output match network coupled to the output port in correspondence of the output transistor at a first port of the output match network,
  wherein:
   during an activated state of the power amplifier unit, the output match network is coupled via a second port of the output match network to an output load of the circuital arrangement, and an amplified RF signal in correspondence of the input RF signal and a current flow from the power supply unit through the output transistor is provided to the output load, and
   during a deactivated state of the power amplifier unit, the output match network is decoupled from the output load of the circuital arrangement and no current flows from the power supply unit through the output transistor:
 and
 3) a load compensation circuit, wherein:
  during operation of the circuital arrangement, one or more of the plurality of power amplifier units are deactivated, and
  the load compensation circuit is configured to control the variable power supply unit such as to compensate a loading effect of the one or more deactivated power amplifier units on the common output port of the power supply unit.

26. The circuital arrangement according to claim 25, wherein the power supply unit comprises an output power control port configured to receive an output power control signal in correspondence of a desired output signal of the power supply unit at the common output port of the power supply unit, and wherein the load compensation circuit is configured to provide the output control signal such as to optimize operation of the circuital arrangement for an activated power amplifier unit in correspondence of a different frequency band and/or mode of operation of the plurality of different frequency bands and/or modes of operation.

27. The circuital arrangement according to claim 26, wherein the load compensation circuit is further configured to adjust the output control signal such as to compensate for the loading effect of the one or more deactivated power amplifier units on the common output port of the power supplier unit.

28. The circuit arrangement according to claim 26 or claim 27, wherein the load compensation circuit is configured to compensate for a change in one or more of: a) a gain parameter, b) a phase parameter, and c) an offset parameter, of the output signal of the power supply unit in correspondence of the loading effect of the one or more deactivated power amplifier units on the common output port of the power amplifier unit.

29. The circuit arrangement according to claim 26, wherein the load compensation circuit further comprises one or more lookup tables, wherein a lookup table of the one or more lookup tables is configured to map a digital representation of an input signal to the load compensation circuit to a digital representation of the output power control signal.

30. The circuit arrangement according to claim 29, wherein the lookup table of the one or more lookup tables is in correspondence of the different frequency band and/or mode of operation of the plurality of different frequency bands and/or modes of operation.

31. The circuit arrangement according to claim 29, wherein the output signal of the power supply unit is an amplified version of the output power control signal.

32. The circuit arrangement according to claim 26, wherein the load compensation circuit further comprises a digital signal processor adapted to generate a digital representation of the output power control signal based on a digital representation of an input signal to the load compensation circuit and a provided gain/phase/offset compensation parameter.

33. A method for reducing loading of a power supply unit in a multi-mode and/or multi-band power amplifier arrangement, the method comprising:
 providing a power supply unit;
 providing a plurality of power amplifier units;
 connecting the plurality of power amplifier units to a common output port of the power supply unit;

selecting a band and/or mode of operation of the amplifier arrangement;

based on the selecting, activating a corresponding power amplifier unit of the plurality of power amplifier units;

based on the selecting, deactivating one or more power amplifier units of the plurality of power amplifier units;

based on the deactivating, decoupling the one or more deactivated power amplifier units from the power supply unit, and based on the decoupling, reducing a loading effect of the one or more deactivated power amplifier units on the power supply unit.

34. The method according to claim 33, further comprising: providing a plurality of switches in correspondence of the plurality of power amplifier units, wherein each switch is configured to remove a current flow from the common output port of the power supply unit to a corresponding deactivated power amplifier unit.

35. The method according to claim 34, wherein the current flow is in correspondence of a conduction path between the common output port of the power supply unit and an output match circuit of the power amplifier unit.

36. The method according to claim 35, wherein the conduction path comprises a reactance in correspondence of the output match circuit of the power amplifier unit.

37. The method according to claim 33, wherein the power supply unit is a variable power supply unit configured to output a dynamic time varying output signal at the common output port of the power supply unit.

38. A method for compensating loading of a power supply unit in a multi-mode and/or multi-band power amplifier arrangement, the method comprising:

providing a variable power supply unit;
providing a plurality of power amplifier units;
connecting the plurality of power amplifier units to a common output port of the power supply unit;
selecting a band and/or mode of operation of the amplifier arrangement;
based on the selecting, activating a corresponding power amplifier unit of the plurality of power amplifier units;
based on the selecting, deactivating one or more power amplifier units of the plurality of power amplifier units, and
based on the deactivating and the activating, compensating a characteristic of a variable output signal at the common output port of the variable power supply unit, wherein the compensating further comprises;
based on the deactivating and the activating, providing a mapping function for compensating the characteristic of the variable output signal;
providing a control signal for the variable power supply unit in correspondence of a desired variable output signal for the activated power supply unit;
applying the mapping function on the control signal;
based on the applying, obtaining a compensated control signal;
feeding the compensated control signal to the variable power supply unit, and
based on the feeding, obtaining the desired variable output signal.

39. The method according to claim 38, wherein the provided control signal is in correspondence of the desired variable output signal assuming only the activated power amplifier unit being connected to the common output port of the power supply unit.

40. The method according to claim 38, wherein the mapping is performed by a lookup table and/or a digital signal processor.

41. A circuital arrangement comprising:
a power supply unit;
a plurality of power amplifier units, wherein two or more power amplifier units of the plurality of power amplifier units are configured to receive power from a common output port of the power supply unit, and to amplify an input radio frequency (RF) signal at an input port of the two or more power amplifier units in correspondence of a different frequency band and/or mode of operation of a plurality of different frequency bands and/or modes of operation, and
a plurality of decoupling switches,
wherein each of the two or more power amplifier units comprises:
an RF amplifier comprising:
an output port in correspondence of an output transistor of the RF amplifier, wherein the output port is operatively coupled to the common output port of the power supply unit;
an input port in correspondence of an input transistor of the RF amplifier, wherein the input port is connected to the input port of the each power amplifier unit,
and
an output match network coupled to the output port in correspondence of the output transistor at a first port of the output match network, and connected to a first decoupling switch port of a decoupling switch of the plurality of decoupling switches at a second port of the output match network, wherein a second decoupling switch port of the decoupling switch is connected to a reference ground,
wherein a third port of an output match network of a power amplifier unit of the two or more power amplifier units is configured to provide an amplified version of an input RF signal to the power amplifier unit of the two or more power amplifier units.

42. A circuital arrangement comprising:
a power supply unit;
a plurality of power amplifier units, wherein two or more power amplifier units of the plurality of power amplifier units are configured to receive power from a common output port of the power supply unit, and to amplify an input radio frequency (RF) signal at an input port of the two or more power amplifier units in correspondence of a different frequency band and/or mode of operation of a plurality of different frequency bands and/or modes of operation, and
a decoupling switch connected to the common output port at a first terminal of the decoupling switch and configured to connect the first terminal to any one of a second terminal of a plurality of second terminals of the decoupling switch,
wherein each of the two or more power amplifier units comprises:
an RF amplifier comprising:
an output port in correspondence of an output transistor of the RF amplifier, wherein the output port is operatively coupled to a second terminal of the plurality of second terminals of the decoupling switch;

an input port in correspondence of an input transistor of the RF amplifier, wherein the input port is connected to the input port of the each power amplifier unit, and an output match network coupled to the output port in correspondence of the output transistor at a first port of the output match network, and connected to a reference ground at a second port of the output match network, wherein a third port of an output match network of a power amplifier unit of the plurality of power amplifier units is configured to provide an amplified version of an input RF signal to the power amplifier unit of the plurality of power amplifier units.

43. The circuital arrangement according to any one of claim 41 or 42, further comprising an output load switch comprising a plurality of first output load switch terminals each connected to the third port of an output match network in correspondence of the two or more power amplifier units, and a second output load switch terminal connected to an output load of the circuital arrangement, wherein the output load switch is configured to connect any one of the plurality of first output load switch terminals to the second output load switch terminal.

44. The circuital arrangement according to claim 42, wherein the power supply unit is a variable power supply configured to output a dynamic time varying output signal at the common output port of the power supply unit based on a signal provided at an output power control port of the power supply unit.

* * * * *